(12) United States Patent
Paik et al.

(10) Patent No.: US 11,161,988 B2
(45) Date of Patent: Nov. 2, 2021

(54) METHOD OF MANUFACTURING ANISOTROPIC CONDUCTIVE FILM USING VERTICAL ULTRASONIC WAVES

(71) Applicant: KOREA ADVANCED INSTITUTE OF SCIENCE AND TECHNOLOGY, Daejeon (KR)

(72) Inventors: KyoungWook Paik, Daejeon (KR); DalJin Yoon, Daejeon (KR); SangHoon Lee, Daejeon (KR)

(73) Assignee: KOREA ADVANCED INSTITUTE OF SCIENCE AND TECHNOLOGY, Daejeon (KR)

( * ) Notice: Subject to any disclaimer, the term of this patent is extended or adjusted under 35 U.S.C. 154(b) by 193 days.

(21) Appl. No.: 15/920,261

(22) Filed: Mar. 13, 2018

(65) Prior Publication Data

US 2018/0298206 A1 Oct. 18, 2018

(30) Foreign Application Priority Data

Apr. 12, 2017 (KR) .................. 10-2017-0047413

(51) Int. Cl.
*H05K 3/32* (2006.01)
*C09D 5/24* (2006.01)
(Continued)

(52) U.S. Cl.
CPC ............. *C09D 5/24* (2013.01); *C09D 109/00* (2013.01); *C09D 127/14* (2013.01); *C09D 133/20* (2013.01); *C09D 177/02* (2013.01); *C09D 177/06* (2013.01); *C09J 7/24* (2018.01); *C09J 7/245* (2018.01); *C09J 7/25* (2018.01);

*H05K 1/144* (2013.01); *H05K 3/323* (2013.01); *H05K 3/368* (2013.01); *C08K 2201/001* (2013.01);
(Continued)

(58) Field of Classification Search
CPC .................. H05K 3/323; H05K 1/144; H05K 2201/2063; H01B 1/20; H01B 13/0026; G06K 19/07745; Y10T 29/49128; Y10T 29/146; Y10T 29/49204; Y10T 29/4922
USPC ........................... 29/831, 840, 874, 876, 883
See application file for complete search history.

(56) References Cited

U.S. PATENT DOCUMENTS 7,276,436 B2 * 10/2007 Kawai .............. G06K 19/07745
257/777
8,486,318 B2 * 7/2013 Kim ...................... C09J 133/08
264/104
(Continued)

FOREIGN PATENT DOCUMENTS

JP 2010-090192 A 4/2010
JP 2012-188-795 A 10/2012
(Continued)

*Primary Examiner* — Donghai D Nguyen
(74) *Attorney, Agent, or Firm* — Seed IP Law Group LLP

(57) ABSTRACT

Disclosed herein are an anisotropic conductive film including a polymer layer that restricts a movement of conductive particles and a method of manufacturing the same. An anisotropic conductive film (ACF) including a plurality of conductive particles according to an embodiment includes a polymer layer in which the plurality of conductive particles is dispersed and disposed and which restricts a movement of the plurality of conductive particles by capturing the conductive particles and an adhesive layer configured on the upper and lower parts of the polymer layer to assign adhesiveness.

14 Claims, 16 Drawing Sheets

(51) Int. Cl.
| | | |
|---|---|---|
| *H05K 3/36* | (2006.01) | |
| *C09D 127/14* | (2006.01) | |
| *C09D 109/00* | (2006.01) | |
| *C09D 133/20* | (2006.01) | |
| *C09D 177/06* | (2006.01) | |
| *C09J 7/24* | (2018.01) | |
| *C09J 7/25* | (2018.01) | |
| *H05K 1/14* | (2006.01) | |
| *C09D 177/02* | (2006.01) | |
| *C09D 7/65* | (2018.01) | |

(52) U.S. Cl.
CPC ........... *C09D 7/65* (2018.01); *C09J 2203/326* (2013.01); *C09J 2301/124* (2020.08); *C09J 2301/314* (2020.08); *C09J 2301/41* (2020.08); *H05K 3/361* (2013.01); *H05K 2201/0215* (2013.01); *H05K 2201/041* (2013.01); *H05K 2201/10128* (2013.01); *H05K 2201/2063* (2013.01); *H05K 2203/0285* (2013.01); *H05K 2203/0292* (2013.01)

(56) References Cited

U.S. PATENT DOCUMENTS

| | | | |
|---|---|---|---|
| 9,505,942 | B2 * | 11/2016 | Landry-Coltrain ......................... C23C 18/1641 |
| 10,561,048 | B2 * | 2/2020 | Svasand ................. B05D 1/005 |
| 2006/0035036 | A1 * | 2/2006 | Yim .......................... C09J 11/04 428/1.1 |

FOREIGN PATENT DOCUMENTS

| | | |
|---|---|---|
| KR | 2007-0025889 A | 3/2007 |
| KR | 2012-0028583 A | 3/2012 |
| KR | 10-2013-0039328 A | 4/2013 |
| KR | 2016-0128536 A | 11/2016 |

\* cited by examiner

METHOD OF MANUFACTURING ANISOTROPIC CONDUCTIVE FILM USING VERTICAL ULTRASONIC WAVES

CROSS REFERENCE TO RELATED APPLICATION

The present application claims the benefit of Korean Patent Application No. 10-2017-0047413 filed in the Korean Intellectual Property Office on Apr. 12, 2017, the entire contents of which are incorporated herein by reference.

TECHNICAL FIELD

The following embodiments relates to an anisotropic conductive film including a polymer layer that restricts a movement of conductive particles and a method of manufacturing an anisotropic conductive film by removing a polymer layer surrounding conductive particles using vertical ultrasonic waves.

BACKGROUND

Description of the Related Art

Adhesives used for electronic packaging is divided into a film form and a paste form depending on its use form, and is divided into conductive, anisotropic conductive and non-conductive adhesives depending on whether they include conductive particles. In general, the adhesives are divided into an anisotropic conductive film(s) (ACF(s)), anisotropic conductive paste (ACP), a non-conductive film (NCF), and non-conductive paste (NCP).

In particular, in the next-generation ultrafine pitch display technology, an ACF containing conductive particles is chiefly used because high resolution and electrical stability are required. A method of connecting electronic parts using the ACF is a process (i.e., a lead-free process) of substituting an existing soldering process. The method is a simple process, eco-friendly and a thermally more stable process because an instant high temperature does not need to be applied to a product (low temperature process). Furthermore, the method has advantages in that it can reduce a process cost using a glass board or a cheap board, such as polyester flex and it can implement an ultrafine electrode pitch (in this case, may be simply called an ultrafine pitch) because an electrical connection is formed using fine conductive particles.

The utilization scope of the adhesives (ACF, NCF) of a film form is gradually widened to the display packaging of a smart card, a liquid crystal display (LCD), a plasma display panel (PDP) and organic light emitting diodes (OLED) and the packaging of a computer, a mobile phone and a communication system owing to the advantages.

The recent products of the electric device market include a greater number of I/O of parts due to high performance and a multi-function. Accordingly, fine pitching or an ultrafine pitching in which the interval between electrodes is essential. The greatest problem in fine pitch packaging is an electrical connection generated due to the interval between bumps and the interval between electrodes.

In particular, in the case of an electrical connection using the ACF, when thermal compression is performed, a movement of conductive particles is generated due to a flow of thermosetting polymer resin and conductive particles are not captured between bumps and between electrodes or a small number of conductive particles are captured. For this reason, a large number of conductive particles must be used to prevent an open or high-resistance connection problem.

However, there occurs a short phenomenon, that is, an electrical error in which electrodes are horizontally electrified because a large number of conductive particles flowing along with polymer are caught between bumps or electrodes. In particular, the problem becomes serious as the display product becomes more fine pitched.

FIGS. 13A and 13B illustrate a conventional anisotropic conductive film (ACF) for an electrical connection having two electrodes. More specifically, FIG. 13A shows a state before a conventional ACF for an electrical connection having two electrodes is bonded. FIG. 13B shows a state after the conventional ACF for an electrical connection having two electrodes is bonded.

Referring to FIGS. 13A and 13B, in a process of connecting the two electrodes of boards 20 and 21 on the upper and lower parts using an ACF 10, a wide space between bumps is filled because a flow of polymer resin is generated. After the polymer resin is hardened, a stable electrical connection can be vertically implemented and an insulating state can be maintained. In this case, the ACF 10 may include a polymer layer 11 including conductive particles and an adhesive layer 12.

However, as an ultrafine pitch electrical connection technology is developed, the space between bumps and between electrodes tends to be reduced and the width between the bumps and between the electrodes tends to be significantly reduced. For such an ultrafine pitch connection, if the conventional ACF 10 is used, there are problems in that an electrical short phenomenon and an unstable contact state are generated.

FIGS. 14A and 14B illustrate an electrical short phenomenon and unstable contact state that appear in the conventional ultrafine pitch connection. More specifically, FIG. 14A shows a state before a conventional ACF including two electrodes of an ultrafine pitch for an electrical connection is bonded. FIG. 14B shows a state after the conventional ACF including two electrodes of an ultrafine pitch for an electrical connection is bonded.

As shown in FIGS. 14A and 14B, the conventional ACF 10 has problems in that it does not suppress a flow of conductive particles attributable to a flow of resin in a bonding process, generates an electrical short circuit due to the agglomeration phenomenon of conductive particles between the narrowed bumps or electrodes of the boards 20 and 21 on the upper and lower parts, and has an unstable connection characteristic due to a loss of many conductive particles.

Korean Patent Application Publication No. 10-2012-0028583 relates to conductive polymer adhesives using such nanofiber, and discloses a technology regarding a nanofiber ACF device containing nanofiber layer that prohibits a movement of conductive balls by putting conductive balls (or conductive particle(s)) into the nanofiber.

However, the nanofiber ACF has a problem in that productivity is deteriorated compared to the existing ACF process because it requires an additional bonding process called a resin flow in order to raise a capture ratio per bump of a conductive ball.

Furthermore, in the case of an ACF for fine pitch chiefly used for an electrical connection, a Japan's ACF product using insulating coating conductive particles and a dual layer yet monopolizes the world ACF market. However, there is a need for the development of a new ACF technology for a fine pitch connection because the Japan's ACF product has many bonding failures in the fine pitch.

BRIEF SUMMARY

Embodiments relate to an anisotropic conductive film including a polymer layer that restricts a movement of conductive particles and a method of manufacturing the same and, more specifically, to a technology regarding an anisotropic conductive film including a polymer layer having tension stress and restricting a movement of conductive particles by capturing the conductive particles.

Furthermore, embodiments provide an anisotropic conductive film capable of an electrical connection in a fine pitch or ultrafine pitch between electrodes or bumps by implementing a high capture ratio using a small number of conductive particles in such a manner that conductive particles consisting of a solder or including a solder are dispersed and disposed and a movement of the conductive particles is restricted by capturing the conductive particles when a flow of resin according to a bonding process is generated, and a method of manufacturing the same.

Furthermore, embodiments provide an anisotropic conductive film including a polymer layer that restricts a movement of conductive particles, wherein an electrical connection is formed between an upper electrode and a lower electrode by removing a polymer skin layer that surrounds the upper and lower parts of conductive particles through a vertical ultrasonic connection, and a method of manufacturing the same.

An anisotropic conductive film (ACF) including a plurality of conductive particles according to an embodiment includes a polymer layer in which the plurality of conductive particles is dispersed and disposed and which restricts a movement of the plurality of conductive particles by capturing the conductive particles and an adhesive layer configured on the upper and lower parts of the polymer layer to assign adhesiveness.

The polymer layer may include polymer connecting the plurality of conductive particles to restrict a movement of the plurality of conductive particles when a flow of resin according to a bonding process is generated.

The polymer skin layer of the polymer layer surrounding upper and lower parts of the plurality of conductive particles disposed within the polymer layer may be removed, and the conductive particles may connect an upper electrode and a lower electrode to form an electrical connection.

The polymer skin layer of the polymer layer surrounding the upper and lower parts of the plurality of conductive particles may be removed through a vertical ultrasonic connection to form the electrical connection between the upper electrode and the lower electrode.

The polymer layer may be fabricated through roll-to-roll coating after the plurality of conductive particles is mixed with a polymer solution.

The polymer layer includes a thermoplastic polymer not having adhesiveness. The adhesive layer may be formed by laminating or dual-coating a polymer adhesive layer of a non-conductive film (NCF) on the upper and lower parts of the polymer layer.

The polymer layer implements a high capture ratio using a small number of initial conductive particles by suppressing a movement of the plurality of conductive particles, and an electrical connection may be formed in a fine pitch or ultrafine pitch in which an interval between electrodes becomes fine.

In an anisotropic conductive film (ACF) including a plurality of conductive particles according to another embodiment, the plurality of conductive particles may include a solder or conductive particles including the solder.

The ACF layer may include a polymer layer in which the plurality of conductive particles including a solder or conductive particles including the solder are dispersed and disposed and which restricts a movement of the plurality of conductive particles by capturing the conductive particles when a flow of resin according to a bonding process is generated and an adhesive layer configured on the upper and lower parts of the polymer layer to assign adhesiveness.

The polymer layer may include a polyacrylonitrile (PAN) polymer layer including the plurality of conductive particles including a solder or conductive particles including the solder.

The plurality of conductive particles may include metal conductive particles on which the solder has been coated.

The polymer skin layer of the polymer layer surrounding upper and lower parts of the plurality of conductive particles disposed within the polymer layer may be removed, and the conductive particles may connect an upper electrode and a lower electrode to form an electrical connection.

The polymer skin layer of the polymer layer surrounding the upper and lower parts of the plurality of conductive particles may be removed through a vertical ultrasonic connection to form the electrical connection between the upper electrode and the lower electrode.

The polymer layer may be fabricated through roll-to-roll coating after the plurality of conductive particles is mixed with a polymer solution.

The polymer layer may include a thermoplastic polymer not having adhesiveness. The adhesive layer may be formed by laminating or dual-coating a polymer adhesive layer of a non-conductive film (NCF) on the upper and lower parts of the polymer layer.

A method of manufacturing an anisotropic conductive film (ACF) including a plurality of conductive particles according to yet another embodiment includes dissolving polymer by mixing the polymer and a solvent at a specific ratio; forming a polymer solution restricting a movement of a plurality of conductive particles by mixing the conductive particles with the dissolved polymer solution; and fabricating a polymer layer restricting a movement of the conductive particles through roll-to-roll coating by which the polymer solution in which the plurality of conductive particles has been mixed and which restricts a movement of the conductive particles passes through a calendar roll along with release paper.

In this case, the polymer layer may restrict a movement of the plurality of conductive particles by capturing the plurality of conductive particles when a flow of resin according to a bonding process is generated.

Furthermore, the method may further include assigning adhesiveness by laminating an adhesive layer including a non-conductive adhesive film (NCF) on the upper and lower parts of the polymer layer.

Furthermore, the method may further include removing a polymer skin layer surrounding upper and lower parts of the plurality of conductive particles disposed within the polymer layer and connecting an upper electrode and a lower electrode through the conductive particles to form an electrical connection.

Connecting the upper electrode and the lower electrode through the conductive particles to form the electrical connection may include removing the polymer skin layer of the polymer layer surrounding the upper and lower parts of the plurality of conductive particles through a vertical ultrasonic bonding process.

The polymer layer may include polymer connecting the plurality of conductive particles and having tension stress restricting a movement of the plurality of conductive particles when a flow of resin according to a bonding process is generated.

The plurality of conductive particles may include a solder or conductive particles including the solder.

The plurality of conductive particles including the solder or the conductive particles including the solder are dispersed and disposed in the polymer layer, and the polymer layer may restrict a movement of the plurality of conductive particles by capturing the plurality of conductive particles when a flow of resin according to a bonding process is generated.

DETAILED DESCRIPTION

Figure 1:
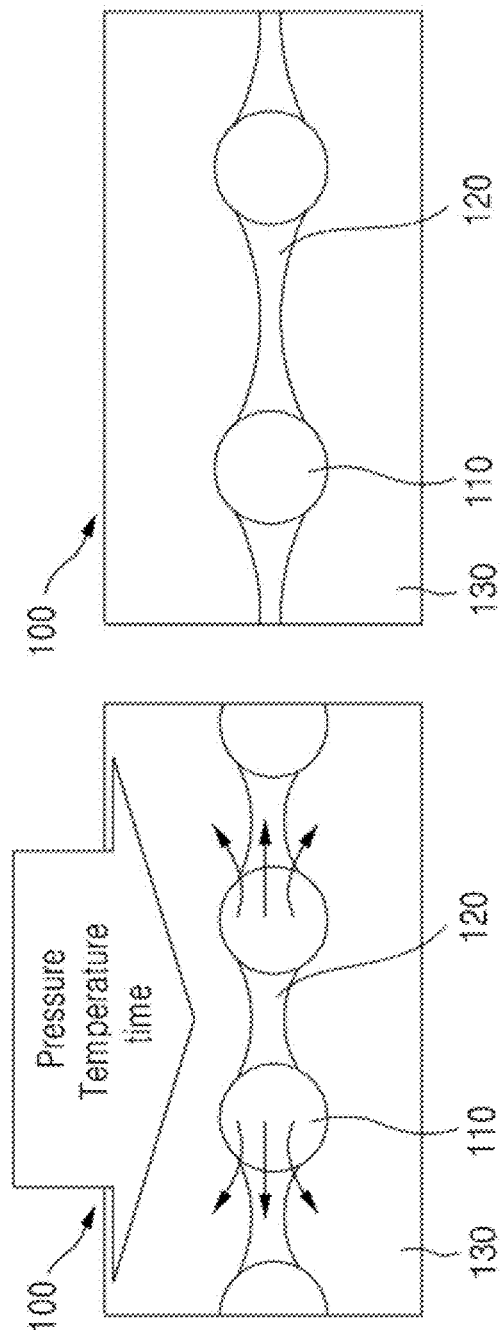
FIGS. 1A and 1B illustrate conductive particles and a movement of a polymer layer that restricts a movement of the conductive particles according to an embodiment.

Hereinafter, embodiments are described with reference to the accompanying drawings. However, the described embodiments may be modified in various other forms and the scope of the present invention is not restricted by the following embodiments. Furthermore, some embodiments are provided to fully describe the present invention to a person having ordinary knowledge in the art to which the present invention pertains. Accordingly, the shapes, sizes, etc. of elements in the drawings may be exaggerated to make the description clear.

The following embodiments can secure excellent electrical connection characteristics by providing a new anisotropic conductive film(s) (hereinafter referred to as an "ACF(s)") including an anchoring polymer layer (hereinafter referred to as an "APL") that restricts a movement of conductive particles. In this case, the APL may mean a polymer layer that restricts a movement of conductive particles, and the new ACF including the APL may be expressed as an ACF including a polymer layer that restricts a movement of conductive particles (may be hereinafter simply expressed as an "APL ACF(s)"). The APL ACF may be formed using a method of dispersing conductive particles into an APL having excellent tension strength and laminating or dual-coating a polymer adhesive layer, that is, a non-conductive film (NCF) of an insulating film, on the upper and lower parts of the APL.

If the APL ACF is used, a movement of the conductive particles can be certainly reduced because the conductive particles are connected by polymer having strong tension stress although a flow of resin is generated.

FIGS. 1A and 1B illustrate conductive particles and a movement of a polymer layer that restricts a movement of conductive particles according to an embodiment.

FIG. 1A shows a movement of conductive particles in the bonding process of an APL ACF according to an embodiment. FIG. 1B shows the state of the polymer layer that restricts a movement of conductive particles after the bonding process of the APL ACF according to an embodiment.

An APL ACF 100 according to an embodiment is described in detail with reference to FIGS. 1A and 1B. In this case, a polymer layer 120 that restricts a movement of conductive particles may be the aforementioned APL.

The ACF 100 containing a plurality of conductive particles according to an embodiment may include the polymer layer 120 and an adhesive layer 130.

A plurality of conductive particles 110 is dispersed and disposed into the polymer layer 120. The polymer layer may capture the plurality of conductive particles 110 and restrict a movement of the conductive particles.

The polymer layer 120 may be formed of polymer that connects the plurality of conductive particles 110 and that has tension stress that restricts a movement of the plurality of conductive particles 110 when a flow of resin according to a bonding process is generated.

In this case, the polymer layer 120 may be formed of a thermoplastic polymer not having adhesiveness. Any thermoplastic polymer having tension stress that restricts a movement of the plurality of conductive particles 110 when a flow of resin according to a bonding process is generated may be used as the polymer layer 120. Accordingly, the width of selection of materials is wide.

For example, materials, such as those of Table 1, may be used as the polymer layer 120.

TABLE 1

| No. | APL polymer | Polymer solvent |
|---|---|---|
| 1 | Polybutadiene succinate (PBS) | Chloroform + N,N-Dimethylmethanamide |
| 2 | Polyvinyl fluoride (PVDF) | Acetone + Dimethylmethanamide |
| 3 | Nylon 666 | Chloroform + Formic acid |
| 4 | Nylon 66 | |
| 5 | Nylon 6 | |
| 6 | Nylon 12 | |
| 7 | Polyacrylonitrile (PAN) | N,N-Dimethylmethanamide |

A polymer skin layer that surrounds the upper and lower parts of the plurality of conductive particles 110 disposed within the polymer layer 120 is removed, and thus the conductive particles may connect an upper electrode and a lower electrode to form an electrical connection.

For example, the polymer skin layer of the polymer layer 120 that surrounds the upper and lower parts of the plurality of conductive particles 110 may be removed through a vertical ultrasonic connection, thereby forming an electrical connection between the upper electrode and the lower electrode.

The polymer layer 120 may be fabricated through roll-to-roll coating after the plurality of conductive particles 110 is mixed into a polymer solution and dispersed.

The adhesive layer may be formed on the upper and lower parts of the polymer layer 120 not having adhesiveness, and may assign adhesiveness.

The adhesive layer may be formed by laminating or dual coating a polymer adhesive layer of a non-conductive film (NCF) on the upper and lower parts of the polymer layer 120. For example, the adhesive layer may be formed of acrylic resin, cationic epoxy resin or anionic epoxy resin.

As described above, the ACF including the plurality of conductive particles 110 according to an embodiment enables an electrical connection in a fine pitch or ultrafine pitch in which the interval between electrodes is fine because the polymer layer 120 suppresses a movement of the plurality of conductive particles 110 and thus a high capture ratio can be implemented using a small number of initial conductive particles.

Figure 2:
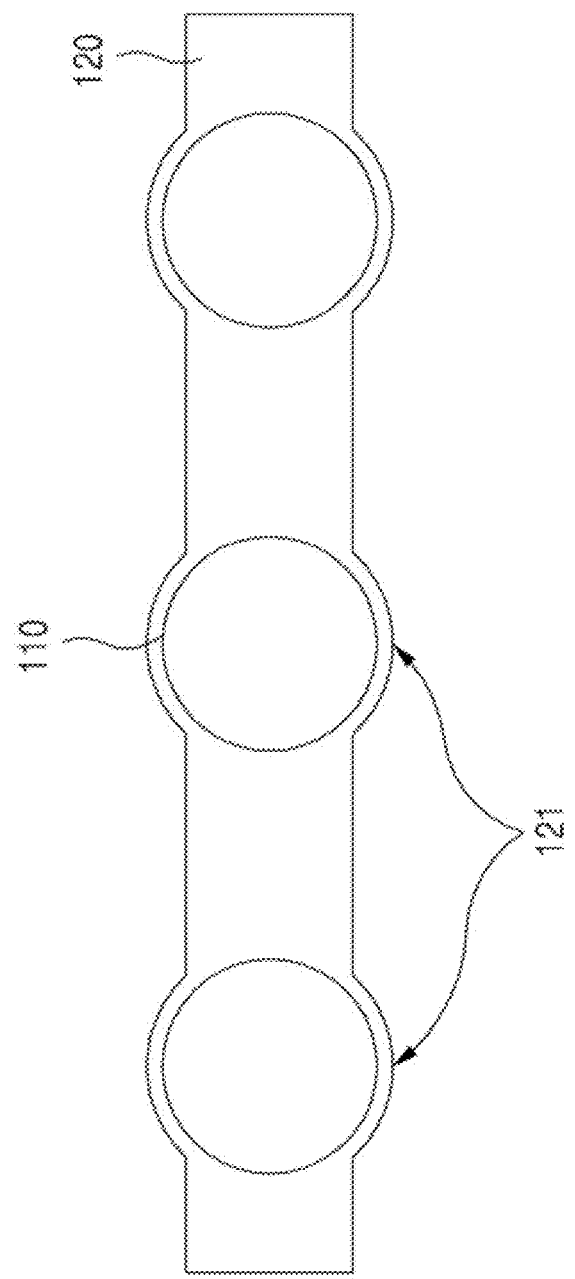
FIG. 2 illustrates a polymer layer from which a polymer skin has not been removed and which restricts a movement of conductive particles according to an embodiment.

FIG. 2 illustrates a polymer layer from which a polymer skin has not been removed and which restricts a movement of conductive particles according to an embodiment.

As shown in FIG. 2, while the polymer layer 120 that restricts a movement of conductive particles is fabricated, the polymer of the polymer layer 120 that restricts a movement of conductive particles surrounds the upper and lower parts of the conductive particles present within the polymer layer 120 that restricts a movement of conductive particles. This is may be said to be a polymer skin layer 121. In the state in which the polymer skin layer 121 has not been removed, if the conductive particles of the polymer layer 120 that restricts a movement of conductive particles is pressed between electrodes, the polymer skin layer 121 hinders a vertical and stable electrical connection. Accordingly, the polymer skin layer 121 of a thin thickness that surrounds the conductive particles may be removed using ultrasonic waves.

Figure 3:
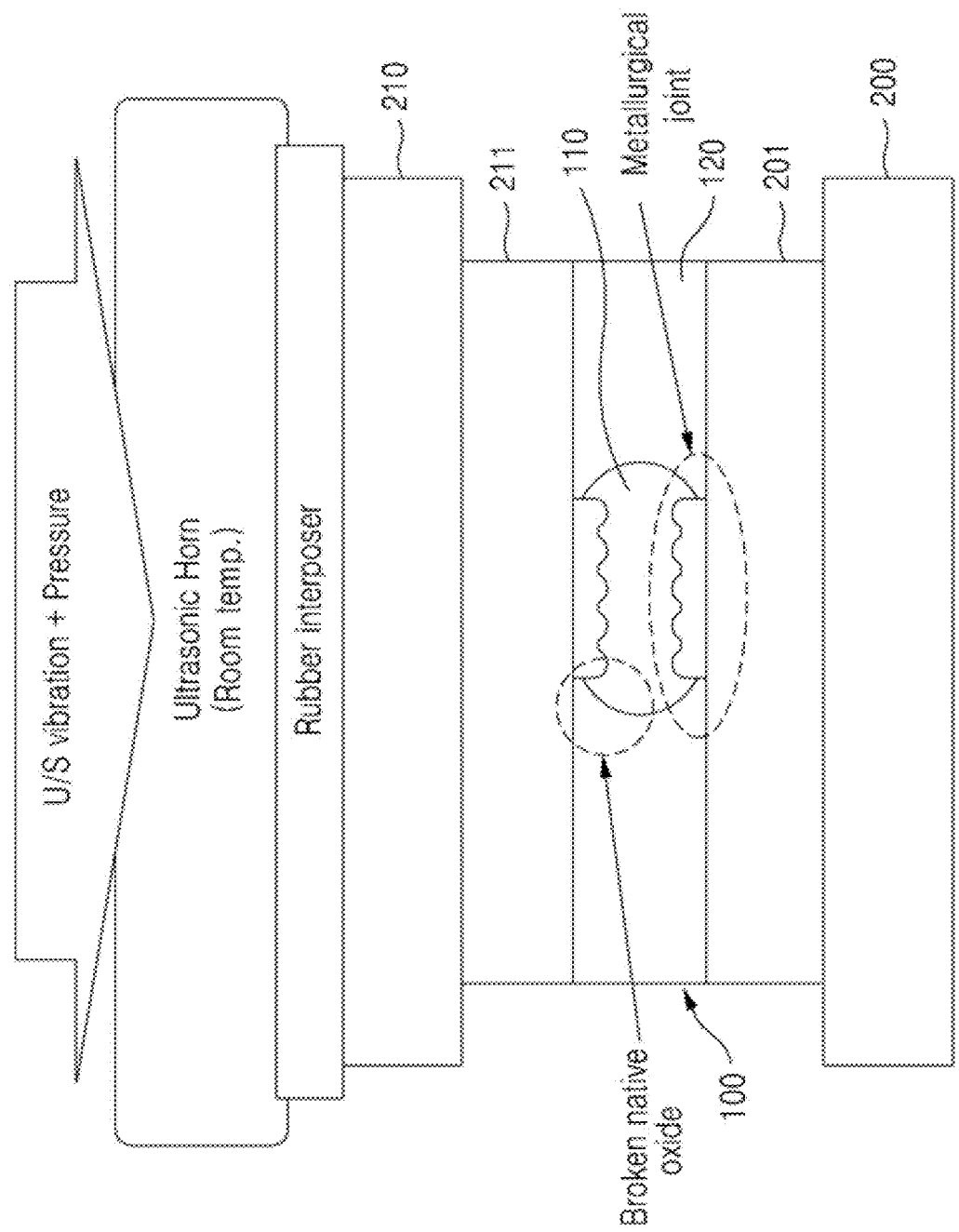
FIG. 3 illustrates a structure of a stable connection state using conductive particles between two electrodes according to an embodiment.

FIGS. 3A and 3B illustrate a structure of a stable connection state using conductive particles between two electrodes according to an embodiment.

FIGS. 3A and 3B show an example of a structure of a stable connection state using conductive particles between two electrodes. The polymer skin layer of a thin thickness that surrounds the conductive particles 110 may be removed using ultrasonic waves. For example, after the polymer skin layer of the conductive particles 110 is removed through a vertical ultrasonic connection, a stable connection may be made between the two electrodes using the conductive particles 110.

The structure of a stable connection state using the conductive particles between two electrodes according to an embodiment may include the ACF 100 including the polymer layer that restricts a movement of conductive particles according to an embodiment, which has been described with reference to FIGS. 1A, 1B, and 2. Furthermore, the structure may include an ACF 100 including a polymer layer that restricts a movement of conductive particles according to another embodiment, which will be described later with reference to FIGS. 6A-6C. The structure including the ACF 100 including the polymer layer that restricts a movement of conductive particles according to an embodiment, described with reference to FIGS. 1A, 1B, and 2, is described as an example.

In the structure including the ACF 100 including the polymer layer that restricts a movement of conductive particles according to an embodiment, the ACF 100 including the polymer layer that restricts a movement of conductive particles may be disposed between an upper board 210 and a lower board 200, and an electric connection may be performed between the two electrodes of a thickness of several tens of μm through the plurality of conductive particles 110 using an ultrasonic (U/S) wave method or by applying heat and pressure.

An upper electrode 211 may be formed under the upper board 210. For example, the upper board 210 may be formed of a flexible printed circuit board (FPCB), but may be formed of a printed circuit board (PCB). However, the present invention is not limited thereto.

Furthermore, a lower electrode 201 may be formed over the lower board 200. For example, the lower board 200 may be formed of a PCB, but may be formed of an FPCB. However, the present invention is not limited thereto.

In this case, the upper board 210 and the lower board 200 may be formed of a fine-pitched or ultrafine-pitched board as the size of an electronic device is reduced.

The ACF 100 including the polymer layer that restricts a movement of conductive particles functions to compress the upper board 210 and the lower board 200, and may include the polymer layer 120 in which the plurality of conductive particles 110 is disposed. In this case, the polymer skin layer surrounding the upper and lower parts of the plurality of conductive particles 110 disposed within the polymer layer 120 is removed, and thus the conductive particles 110 connects the upper electrode 211 of the upper board 210 and the lower electrode 201 of the lower board 200, thereby forming an electrical connection.

More specifically, the ACF 100 including the polymer layer that restricts a movement of conductive particles may include the polymer layer 120 and the adhesive layer. The polymer layer 120 has the plurality of conductive particles 110 dispersed and disposed therein, and may restrict a movement of the plurality of conductive particles 110 by capturing the conductive particles.

In this case, the polymer skin layer surrounding the upper and lower parts of the plurality of conductive particles 110 disposed within the polymer layer 120 is removed, and thus the conductive particles 110 connect the upper electrode 211 and the lower electrode 201 to form an electrical connection therebetween. For example, the polymer skin layer of the polymer layer 120 that surrounds the upper and lower parts of the plurality of conductive particles 110 is removed through a vertical ultrasonic connection, thereby being capable of forming an electrical connection between the upper electrode 211 and the lower electrode 201.

Accordingly, a stable electrical connection can be finally formed because the polymer skin layer of the conductive particles is effectively removed through a vertical ultrasonic connection. Furthermore, a movement of the conductive particles 110 is suppressed using the polymer layer 120 that restricts a movement of conductive particles is used. Accordingly, a fine pitch connection can be formed using the cheap ACF 100 including the polymer layer that restricts a movement of conductive particles because a high capture ratio of the conductive particles 110 is implemented although a small number of initial conductive particles 110 is used, and thus price competitiveness can be secured.

Figure 4A:
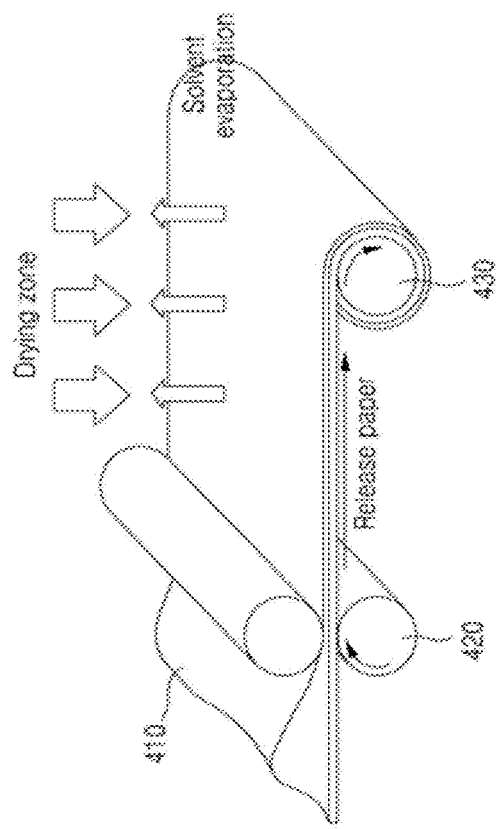
FIGS. 4A and 4B illustrate an example of a process of manufacturing a polymer layer that restricts a movement of conductive particles according to an embodiment.
Figure 4B:
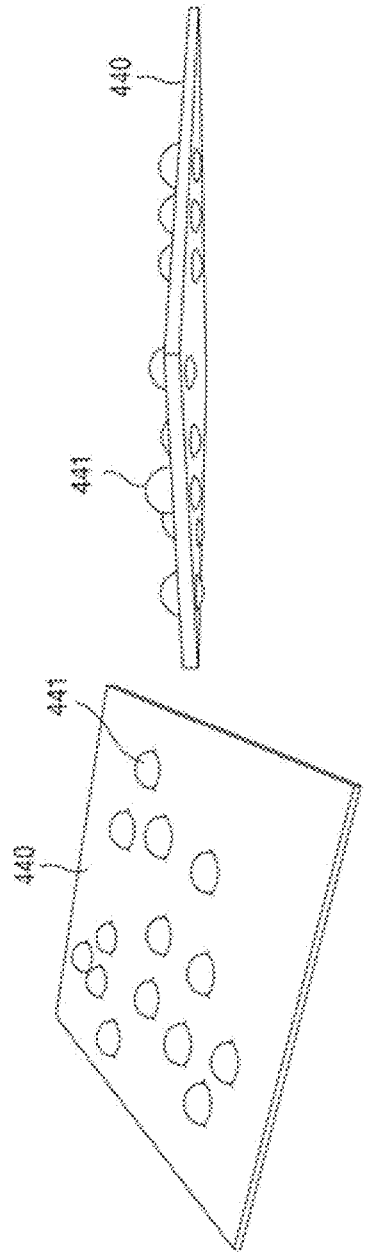

FIGS. 4A and 4B illustrate an example of a process of manufacturing the polymer layer that restricts a movement of conductive particles according to an embodiment.

Referring to FIG. 4A, the polymer layer that restricts a movement of conductive particles may be easily fabricated through a roll-to-roll coating method after conductive particles are disposed into a solution 410 in which conductive particles and a polymer solution have been mixed. In this case, a calendar roll 420 that dries the mixed solution 410 by passing the mixed solution 410 between roles may be used. Release paper for moving the solution may be used. Furthermore, a receiving roll 430 for a movement may be used.

Accordingly, as shown in FIG. 4B, a polymer layer 440 that restricts a movement of conductive particles may be formed. A plurality of conductive particles 441 is dispersed and disposed in the polymer layer 440 that restricts a movement of conductive particles. Accordingly, the polymer layer can fix the conductive particles by restricting a movement of the conductive particles although polymer resin moves.

In this case, the polymer layer 440 that restricts a movement of conductive particles must be assigned adhesiveness so that the polymer layer can be used for a display application because it is a thermoplastic polymer not having adhesiveness. Accordingly, adhesiveness may be assigned to the polymer layer by configuring an adhesive layer on the upper and lower parts of the polymer layer 440 that restricts a movement of conductive particles.

Figure 5:
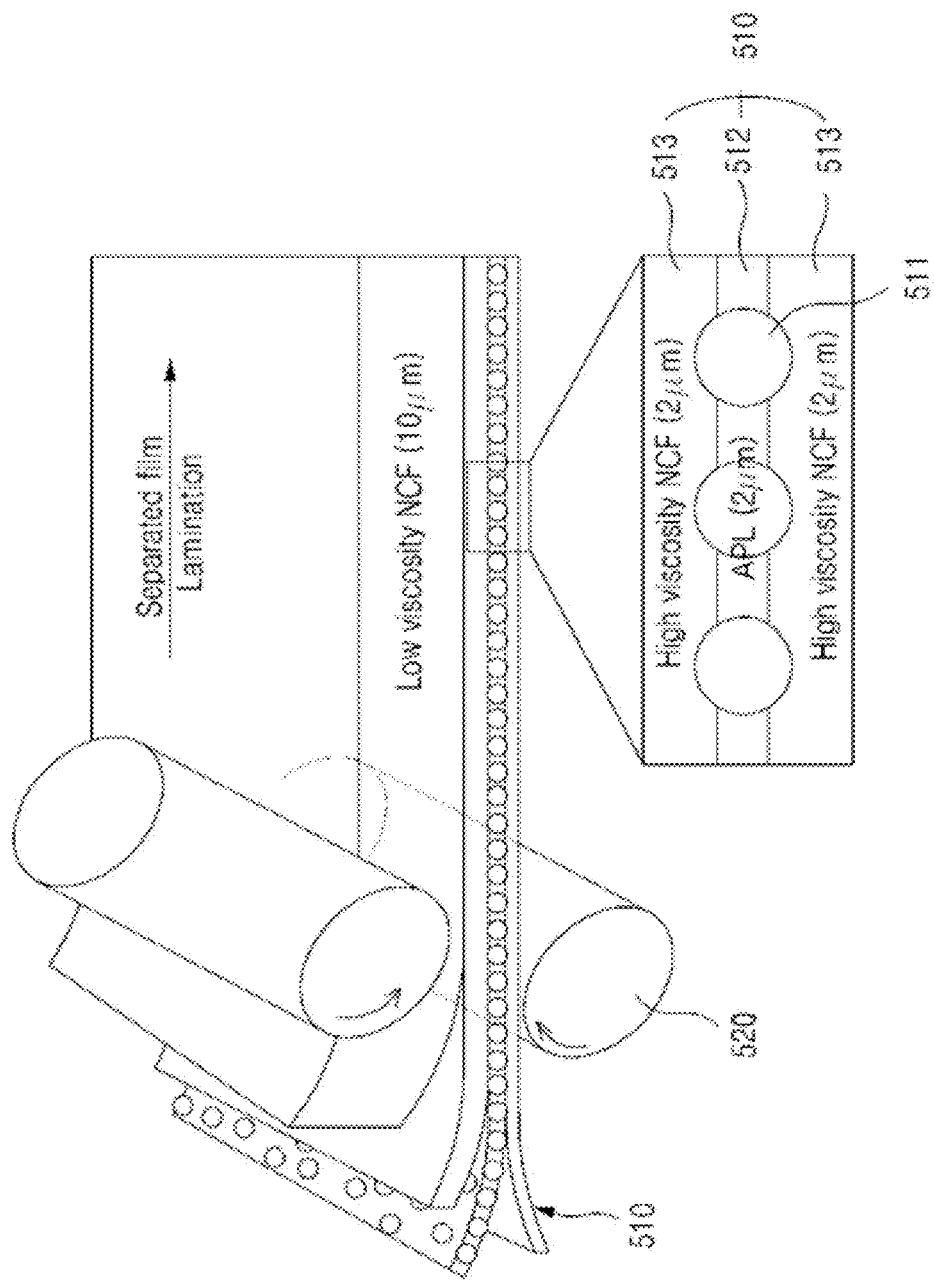
FIG. 5 shows a method of manufacturing an anisotropic conductive film including a polymer layer that restricts a movement of conductive particles according to an embodiment.

FIG. 5 shows a method of manufacturing an APL ACF according to an embodiment.

Referring to FIG. 5, in the method of manufacturing the APL ACF 510 according to an embodiment, after a polymer solution and a plurality of conductive particles 511 are mixed and dispersed, a polymer layer 512 that restricts a movement of conductive particles may be fabricated by performing roll-to-roll coating on the polymer solution with which the plurality of conductive particles 511 has been mixed.

Furthermore, adhesiveness may be assigned to the polymer layer by laminating adhesive layers 513 formed of a non-conductive adhesive film (hereinafter referred to as an "NCF") on the upper and lower parts of the polymer layer 512 that restricts a movement of conductive particles.

Furthermore, a polymer skin layer that surrounds the upper and lower parts of the plurality of conductive particles 511 disposed within the polymer layer 512 that restricts a movement of conductive particles may be removed. Accordingly, the plurality of conductive particles 511 directly connects an upper electrode and a lower electrode, thereby being capable of forming an electrical connection.

Figure 16:
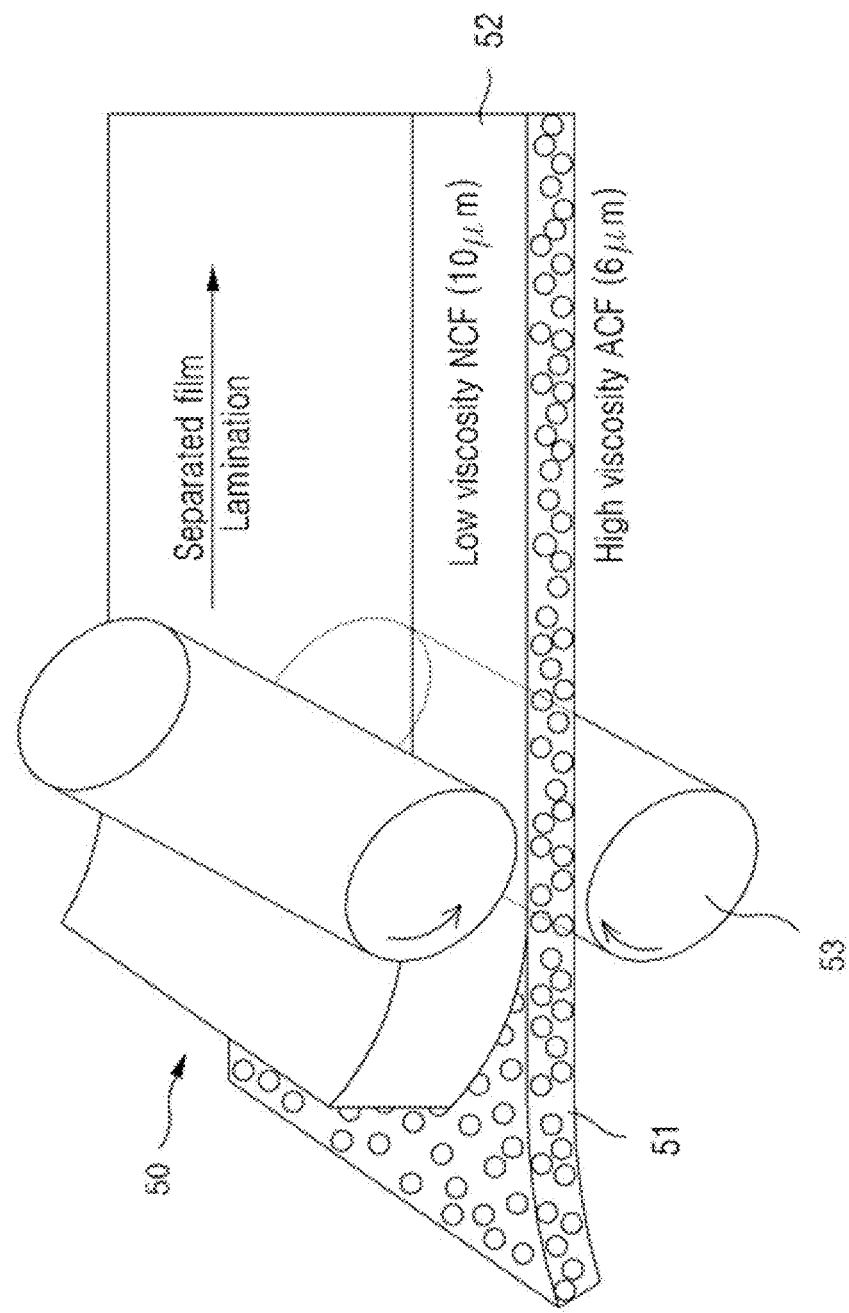
FIG. 16 shows a conventional method of manufacturing an ACF.

FIG. 16 shows a conventional process of manufacturing an ACF.

A process of manufacturing the APL ACF 510 according to an embodiment may be compared with a conventional process of manufacturing an ACF with reference to FIGS. 5 and 16.

In the process of manufacturing the APL ACF 510 according to an embodiment, the APL ACF 510 can be simply fabricated through a lamination process with the adhesive layer 513, that is, an NCF not containing conductive particles using the roll laminator 520 which is the same as or similar to that of the conventional process of fabricating an ACF 51.

As shown in FIG. 16, in the case of the conventional ACF 50, when a lamination process is performed using the roll laminator 53 of a polymer layer 51 containing conductive particles and an NCF 52, a flow of the conductive particles may occur because a flow of resin of the NCF 52 is generated due to an electrical connection.

In contrast, as shown in FIG. 5, in the APL ACF 510 according to an embodiment, when bonding is performed using the ACF 510 including the adhesive layer 513, that is, an NCF, and the polymer layer 512 to which adhesiveness has been assigned due to a lamination process and that restricts a movement of conductive particles, the conductive particles 511 have been captured by the polymer layer 512 that restricts a movement of conductive particles. Accordingly, a movement of the conductive particles 511 is rarely generated regardless of a flow of resin of the adhesive layer 513, that is, an NCF. As a result, a movement of the conductive particles 511 can be suppressed prior to and after bonding.

Figures 6A, 6B, 6C:
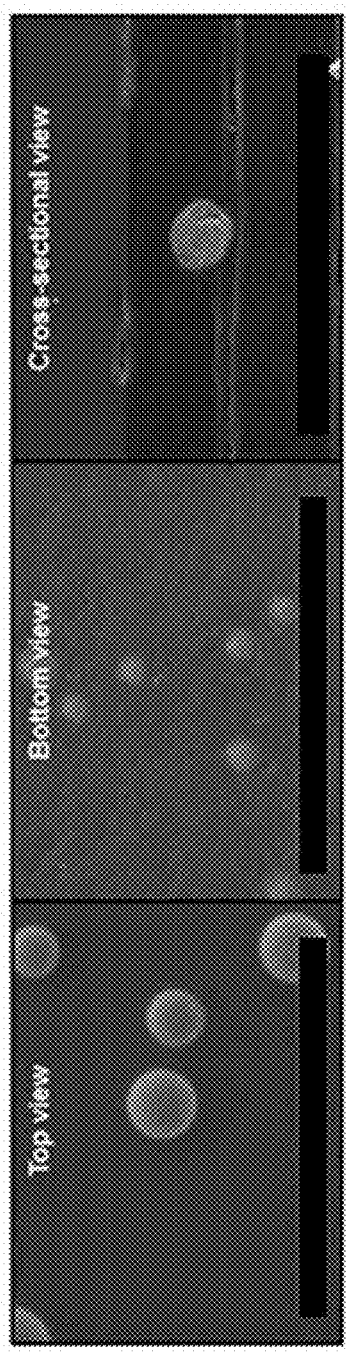
FIGS. 6A-6C show a surface and cross section of a polymer layer that restricts a movement of conductive particles containing solder particles according to another embodiment.

FIGS. 6A-6C show a surface and cross section of a polymer layer that restricts a movement of conductive particles containing solder particles according to another embodiment.

FIG. 6A shows a top view of the polymer layer that restricts a movement of conductive particles containing solder particles according to another embodiment. FIG. 6B shows a bottom view of the polymer layer that restricts a movement of conductive particles containing solder particles according to another embodiment. FIG. 6C shows a cross-sectional view of the polymer layer that restricts a movement of conductive particles containing solder particles according to another embodiment.

In this case, a solder or particles containing a solder may be used as the conductive particles. For example, the conductive particles may be an Sn-3Bi-0.5Cu(SAC305) solder. Furthermore, the conductive particles may be a solder including one or more of tin (Sn), bismuth (Bi), copper (Cu), and lead (Pb) or may be particles including the solder. If the solder of Sn—Bi—Cu or particles including the solder of Sn—Bi—Cu are used as the conductive particles, the ACF can have a high hardness characteristic.

As described above, the ACF that restricts a movement of conductive particles according to another embodiment may include a plurality of conductive particles that includes a solder or conductive particles including the solder.

Furthermore, the ACF may include a polymer layer in which a plurality of conductive particles including a solder or conductive particles including the solder is dispersed and disposed and which restricts a movement of the conductive particles by capturing the conductive particles when a flow of resin according to a bonding process is generated and an adhesive layer disposed on the upper and lower parts of the polymer layer to assign adhesiveness.

In this case, the polymer layer may include a thermoplastic polymer not having adhesiveness. Furthermore, the polymer layer may include a polyacrylonitrile (PAN) polymer layer including a plurality of conductive particles that includes a solder or conductive particles including the solder. The polymer layer may be fabricated through roll-to-roll coating after the plurality of conductive particles is mixed with a polymer solution and dispersed.

For example, the plurality of conductive particles may include a solder. For another example, the plurality of conductive particles may include conductive particles including the solder. For yet another example, the plurality of conductive particles may include metal conductive particles on which the solder has been coated.

The polymer skin layer of the polymer layer that surrounds the upper and lower parts of the plurality of conductive particles disposed within the polymer layer may be removed, and thus the conductive particles may connect an upper electrode and a lower electrode to form an electrical connection.

The polymer skin layer of the polymer layer that surrounds the upper and lower parts of the plurality of conductive particles is removed through a vertical ultrasonic connection, so an electrical connection may be formed between the upper electrode and the lower electrode.

A polymer adhesive layer of a non-conductive film (NCF) may be formed on the upper and lower parts of the polymer layer through lamination or dual coating.

For example, FIGS. 6A-6C show a distribution of initial conductive particles included in the ACF prior to the bonding process if the Sn-3Bi-0.5Cu(SAC305) solder is used as the conductive particles. In the distribution of the initial conductive particles included in the ACF prior to the bonding process, it may be seen with the naked eye that a distribution of conductive particles, such as a PAN APL solder ACF, is very small compared to a common a solder ACF that shows stable connection results.

In this case, in order to check an effect of the PAN APL during the bonding process, a conventional solder ACF in which density of conductive particles has been controlled as in a distribution of the conductive particles of the PAN APL solder ACF may be fabricated and compared.

Figures 7A, 7B, 7C:
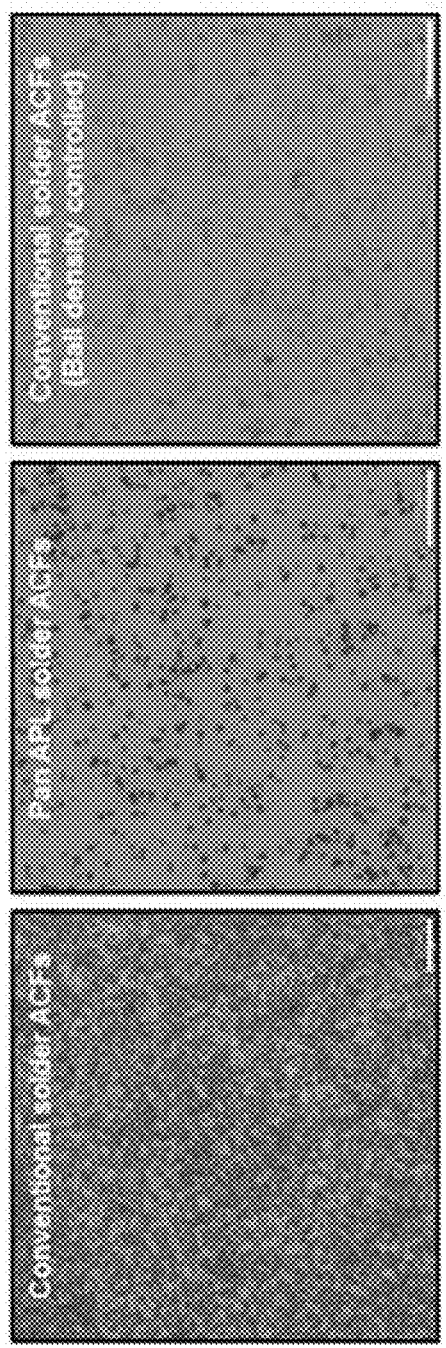
FIGS. 7A-7C show a distribution of solder conductive particles of an anisotropic conductive film including an anchoring polymer layer containing solder particles according to another embodiment.

FIGS. 7A-7C show a distribution of solder conductive particles of an ACF including an anchoring polymer layer containing solder particles according to another embodiment.

A distribution of the solder conductive particles of the ACF including the anchoring polymer layer that contains solder particles according to another embodiment may be compared with a distribution of the solder conductive particles of a conventional solder ACF with reference to FIGS. 7A-7C.

FIG. 7B shows a distribution of the solder conductive particles of the PAN APL solder ACF according to another embodiment. Furthermore, FIG. 7A shows a distribution of the solder conductive particles of a conventional solder ACF, and FIG. 7C shows a distribution of the solder conductive particles of a conventional solder ACF in which density of conductive particles has been controlled.

From the drawings, a wetting shape of the solder in an electrode can be checked depending on the type of ACF after the same bonding process for the PAN APL solder ACF, the conventional solder ACF and the conventional solder ACF in which density of conductive particles has been controlled.

It may be seen that the wetting area of the PAN APL solder ACF has a level similar to the wetting area of the conventional ACF in which a distribution of solder conductive particles is great per unit area. It may be seen that there is almost no residual of conductive particles between the electrodes compared to the conventional solder ACF. Furthermore, it may be seen that the wetting area of the conventional solder ACF in which density of the conductive particles has been controlled to the same level as that of the PAN APL solder ACF is very small.

Figures 8A, 8B, 8C:
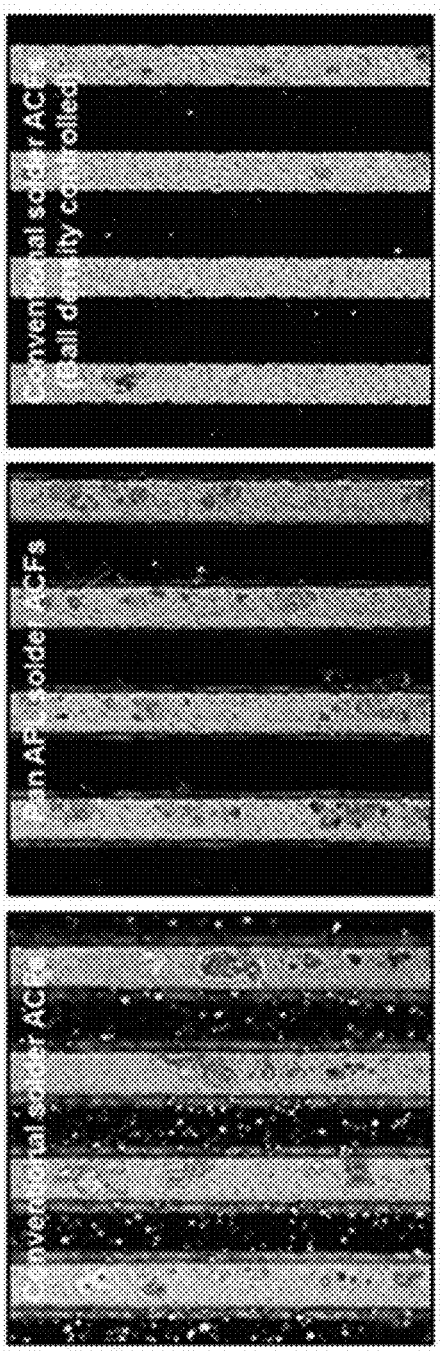
FIGS. 8A-8C show the wetting area of solder conductive particles after the bonding process of an anisotropic conductive film including an anchoring polymer layer containing solder particles according to another embodiment.

FIGS. 8A-8C show the wetting area of solder conductive particles after the bonding process of an ACF including an anchoring polymer layer containing solder particles according to another embodiment.

Referring to FIGS. 8A-8C, as in FIGS. 7A-7C, the wetting area of solder conductive particles after the bonding process of an ACF including an anchoring polymer layer that contains solder particles according to another embodiment may be compared with the wetting area of solder conductive particles after the bonding process of a conventional solder ACF.

FIG. 8B shows the wetting area of the solder conductive particles after the bonding process of the PAN APL solder ACF according to another embodiment. Furthermore, FIG. 8A shows the wetting area of solder conductive particles after the bonding process of the conventional solder ACF, and FIG. 8C shows the wetting area of solder conductive particles after the bonding process of the conventional solder ACF in which density of the conductive particles has been controlled.

Figure 9:
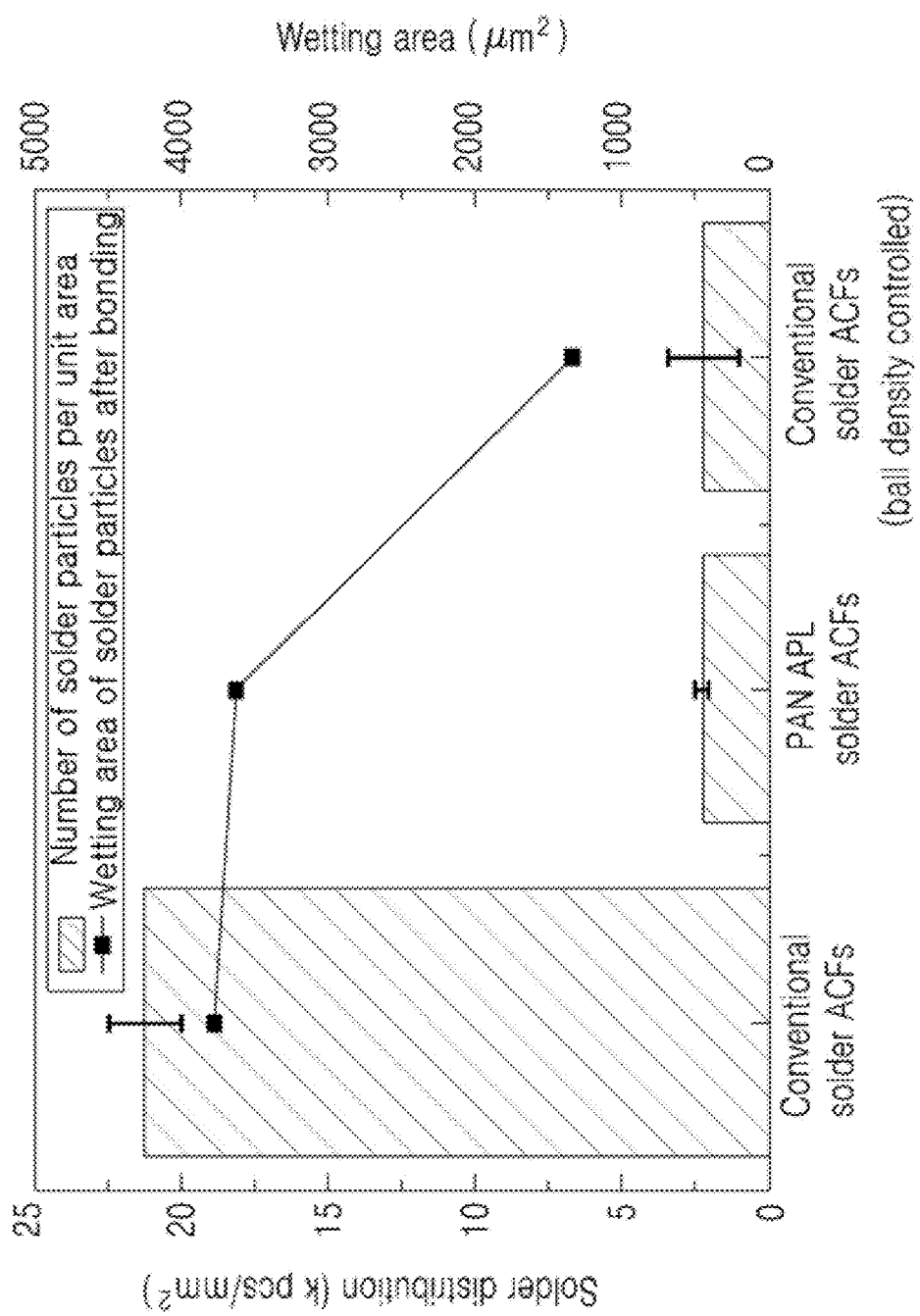
FIG. 9 is a graph for illustrating the distribution density versus wetting area of solder conductive particles per unit area of an anisotropic conductive film including an anchoring polymer layer containing solder particles according to another embodiment.

FIG. 9 is a graph for illustrating the distribution density versus wetting area of solder conductive particles per unit area of the ACF including an anchoring polymer layer containing solder particles according to another embodiment.

FIG. 9 shows a comparison between the distribution densities versus wetting areas of solder conductive particles per unit area for each type of ACF in the PAN APL solder ACF, the conventional solder ACF and the conventional solder ACF in which density of the conductive particles has been controlled.

The wetting area of the solder conductive particles after the bonding process may be quantitatively calculated compared to the distribution density of conductive particles, that is, the number of solder conductive particles per unit area according to the type of each ACF.

Accordingly, in the case of the PAN APL solder ACF containing the solder conductive particles according to another embodiment, assuming that the same wetting area is implemented after the bonding process compared to the conventional solder ACF, it may be concluded that the number of conductive particles, that is, about 1/10, may be contained.

This evidences that the structure of the APL having a high tension strength value in the PAN APL solder ACF containing the solder conductive particles according to another embodiment strongly suppresses a movement of the conductive particles according to a flow of resin generated when the bonding process is performed, and shows that the structure has a stable characteristic through a very small number of conductive particles.

Figure 10:
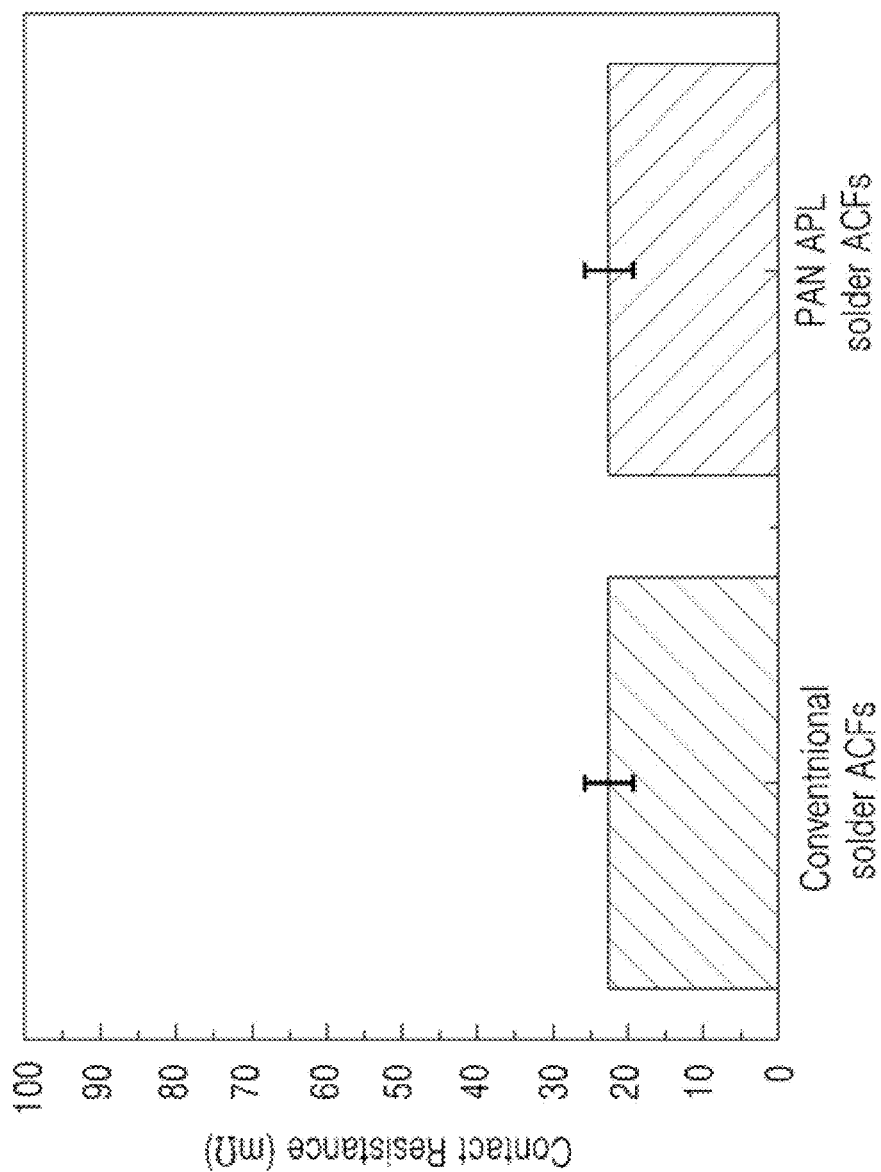
FIG. 10 is a graph for illustrating contact resistance of an anisotropic conductive film including an anchoring polymer layer containing solder particles according to another embodiment.

FIG. 10 is a graph for illustrating contact resistance of an ACF including an anchoring polymer layer containing solder particles according to another embodiment.

As the results of the measurement of contact resistance after the bonding process of the ACF, it was found that the conventional solder ACF and the PAN APL solder ACF according to another embodiment have similar contact resistance as in FIGS. 8A-8C. The reason for this is that after the bonding process, the two ACFs had the same wetting area of the solder and the interval between the two electrodes (i.e., a joint gap size) after the bonding process is the same as shown in FIG. 10.

Figures 11A, 11B:
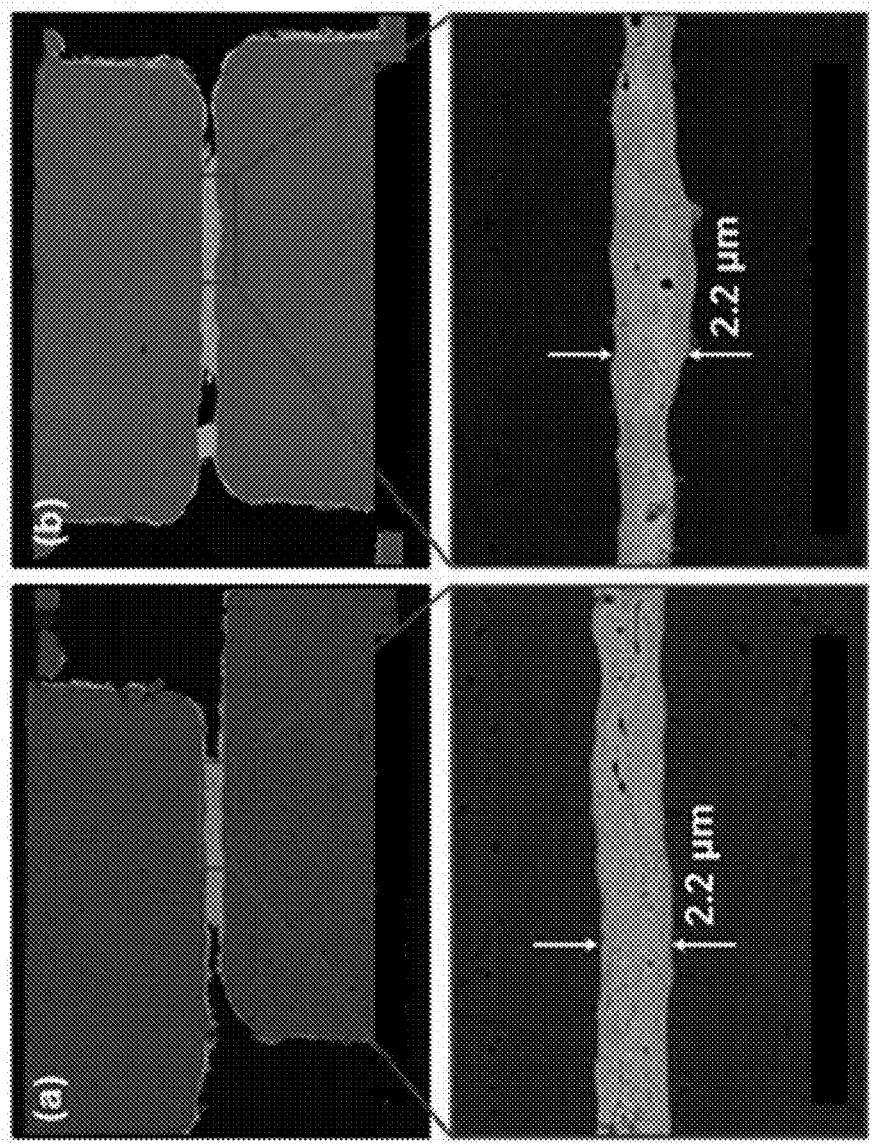
FIGS. 11A and 11B show a joint shape after a bonding process according to another embodiment.

FIGS. 11A and 11B show a joint shape after a bonding process according to another embodiment.

FIG. 11A shows a joint shape after the bonding process of the conventional solder ACF, and FIG. 11B shows a joint shape after the bonding process of the PAN APL solder ACF according to another embodiment.

Figure 12:
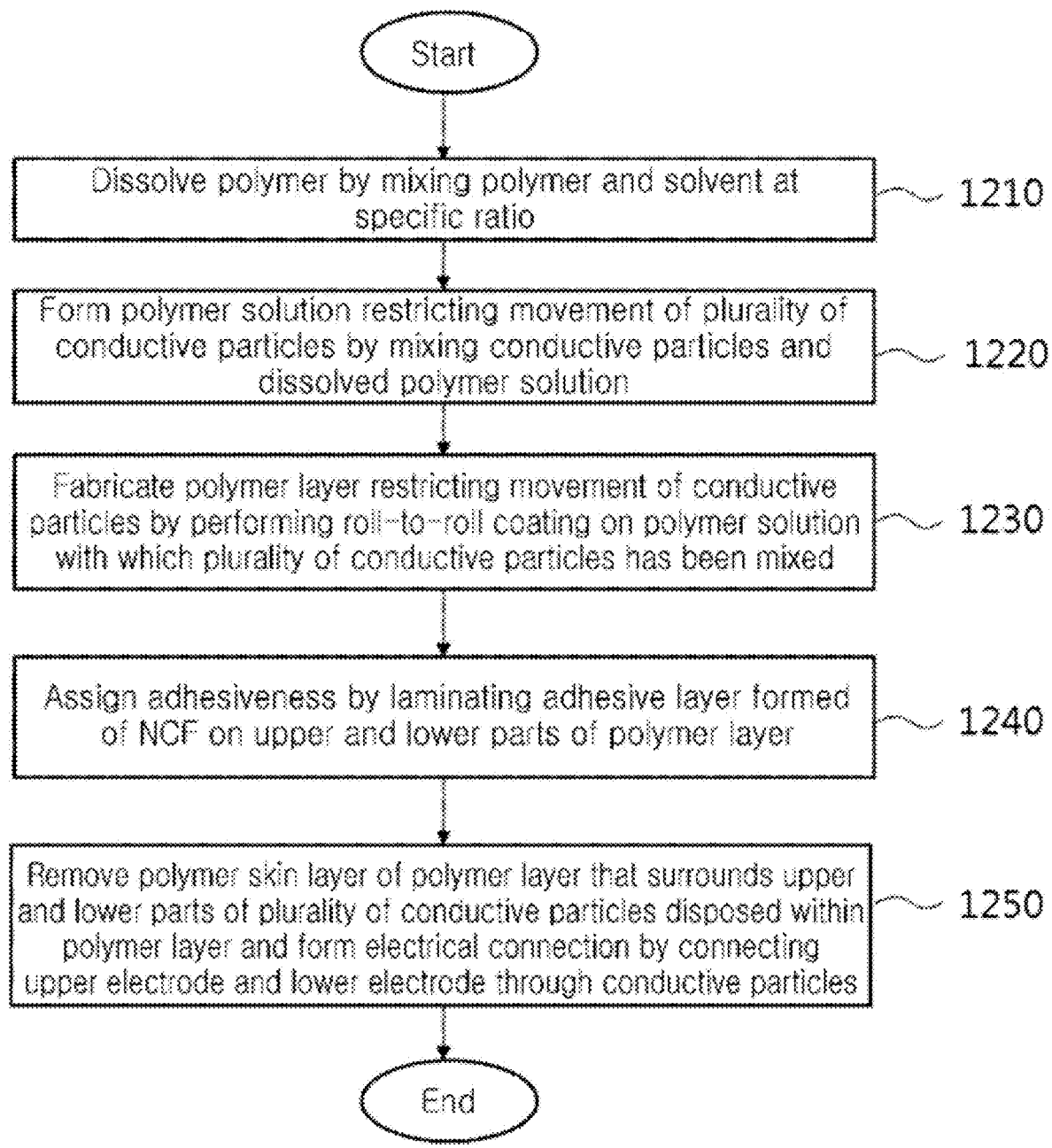
FIG. 12 is a flowchart showing a method of manufacturing an anisotropic conductive film including a polymer layer that restricts a movement of conductive particles according to an embodiment.
Figure 13A:
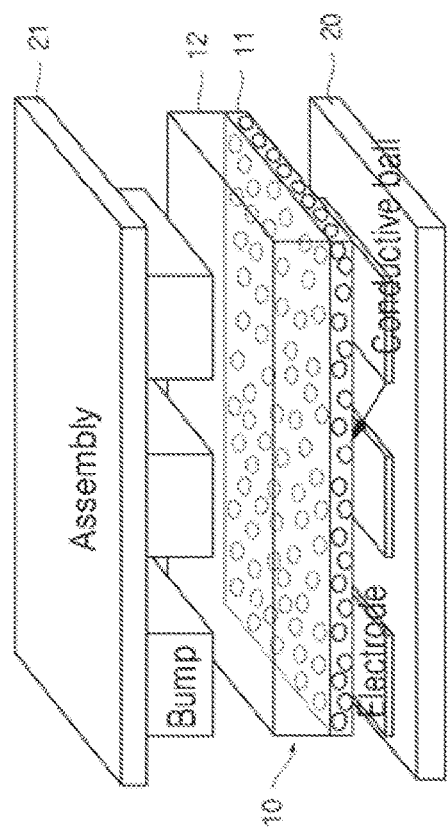
FIGS. 13A and 13B illustrate a conventional anisotropic conductive film (ACF) for an electrical connection having two electrodes.
Figure 13B:
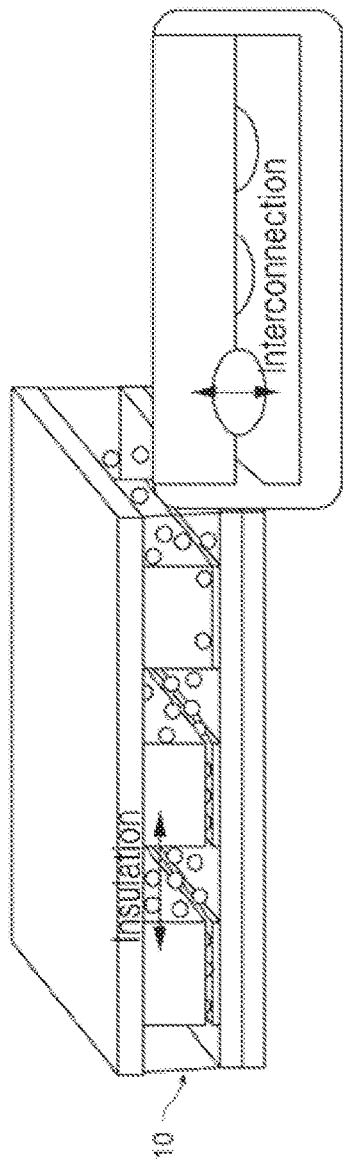
Figure 14A:
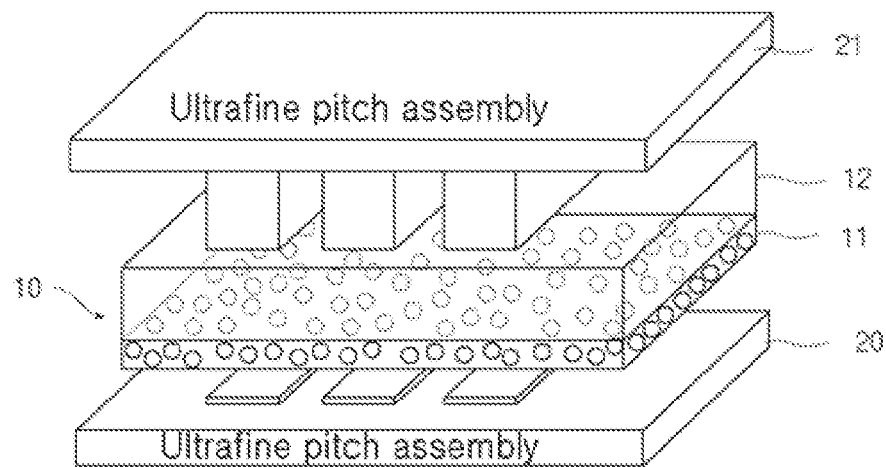
FIGS. 14A and 14B illustrate an electrical short phenomenon and unstable contact state that appear in a conventional ultrafine pitch connection.
Figure 14B:
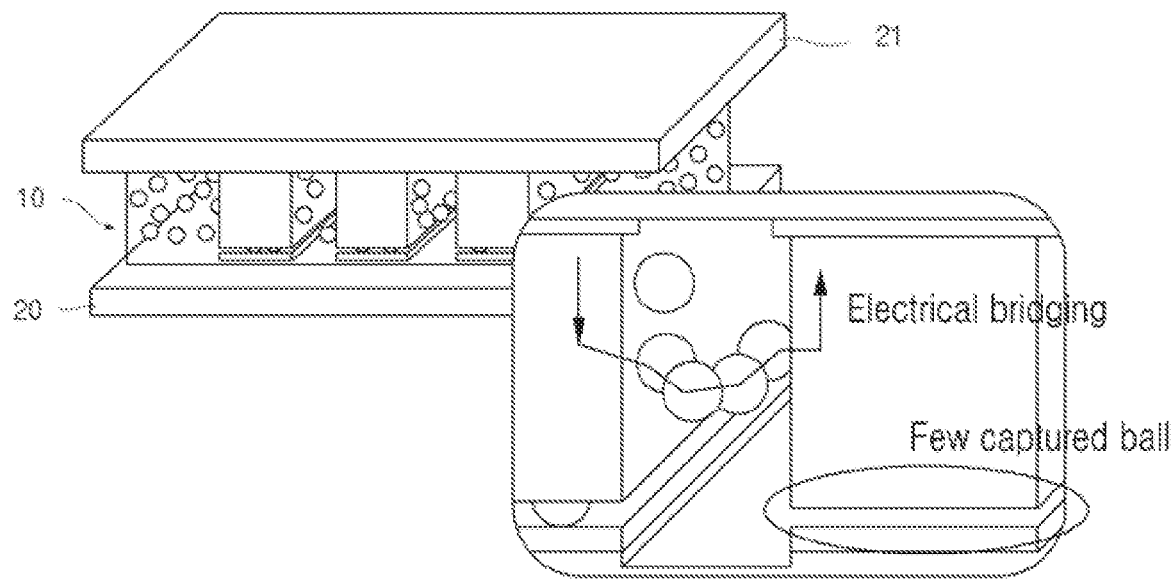

FIG. 12 is a flowchart showing a method of manufacturing an APL ACF according to an embodiment.

Referring to FIG. 12, the method of manufacturing an APL ACF according to an embodiment includes dissolving polymer by mixing the polymer and a solvent at a specific ratio at step 1210, forming a polymer solution that restricts a movement of a plurality of conductive particles by mixing the conductive particles with the dissolved polymer solution at step 1220, and fabricating a polymer layer that restricts a movement of the conductive particles by performing roll-to-roll coating on the polymer solution with which the plurality of conductive particles has been mixed and that restricts a movement of the conductive particles at step 1230.

Furthermore, the method may further include assigning adhesiveness by laminating an adhesive layer formed of an NCF on the upper and lower parts of the polymer layer at step 1240.

Furthermore, the method may further include removing the polymer skin layer of the polymer layer that surrounds the upper and lower parts of the plurality of conductive particles disposed within the polymer layer and forming an electrical connection by connecting an upper electrode and a lower electrode through the conductive particles at step 1250.

In this case, the polymer layer may restrict a movement of the plurality of conductive particles by capturing the conductive particles when a flow of resin according to a bonding process is generated.

The steps of the method of manufacturing the APL ACF according to an embodiment are described in detail below by taking an example.

The method of manufacturing an APL ACF according to an embodiment may be used to fabricate the APL ACF described with reference to FIGS. 1A to 11B. For example, the method may be implemented by a system for fabricating an ACF.

At step 1210, the polymer may be dissolved by mixing the polymer and the solvent at a specific ratio. In this case, the content of the polymer is 7 wt % or more. If the content of the polymer of less than 7 wt % is dissolved, a film is not formed in a dry process, that is, one of processes of forming the film.

At step 1220, the polymer solution that restricts a movement of the conductive particles may be formed by mixing the plurality of conductive particles with the dissolved polymer solution. At this time, the plurality of conductive particles may be dispersed and disposed in the polymer solution in which the plurality of conductive particles has been mixed.

At step 1230, the polymer layer that restricts a movement of the conductive particles may be fabricated by performing roll-to-roll coating on the polymer solution in which the plurality of conductive particles has been mixed and that restricts a movement of the conductive particles. In this case, the polymer layer may restrict a movement of the plurality of conductive particles by capturing the plurality of conductive particles when a flow of resin according to a bonding process is generated.

More specifically, the polymer solution in which the plurality of conductive particles has been mixed and that that restricts a movement of the conductive particles is injected into the entry of a roll-to-roll film coater. Thereafter, the two rolls may be rotated at a specific speed so that the polymer solution passes through a narrow gap between the two rolls. Thereafter, the solvent may be evaporated through a dry section, so the polymer layer that restricts a movement of the conductive particles may be fabricated. The polymer layer may be formed of polymer that connects the plurality of conductive particles and that has tension stress restricting a movement of the plurality of conductive particles when a flow of resin according to a bonding process is generated.

Furthermore, the plurality of conductive particles may be a solder or conductive particles including the solder. The plurality of conductive particles including a solder or conductive particles including the solder is dispersed and disposed in the polymer layer, and thus the polymer layer may restrict a movement of the plurality of conductive particles by capturing the conductive particles when a flow of resin according to a bonding process is generated.

At step 1240, after the polymer layer that restricts a movement of the conductive particles is fabricated, adhesiveness may be assigned to the polymer layer by laminating the adhesive layer formed of an NCF on the upper and lower parts of the polymer layer.

At step 1250, the polymer skin layer of the polymer layer that surrounds the upper and lower parts of the plurality of conductive particles disposed within the polymer layer, and thus the conductive particles connect the upper electrode and the lower electrode to form an electrical connection.

In this case, the polymer skin layer of the polymer layer that surrounds the upper and lower parts of the plurality of conductive particles may be removed through a vertical ultrasonic bonding process.

In accordance with the embodiments, when the bonding process of an ACF using an APL containing metal conductive particles based on various thermoplastic polymers and an APL ACF is performed, an excellent electrical connection can be formed by removing the polymer skin layer surrounding the conductive particles using vertical ultrasonic waves.

This method enables conductive particles to be exposed from polymer by generating vertical ultrasonic waves and also enables a simultaneous connection during a bonding process compared to an existing expensive plasma etching method for exposing conductive particles surrounded by polymer.

The ACF including the polymer layer that fundamentally suppresses a movement of the conductive particles is a new structure different from the conventional ACF. Accordingly, a movement of conductive particles can be further suppressed without a limit to materials, a form and a fabrication method without being limited to expensive nanofiber.

Furthermore, the width of selection of polymer materials used is wide, and a cheap process is made possible through vertical ultrasonic waves generated during a bonding process without the intervention of an expensive plasma etching process.

A display having an ultrafine pitch assembly is mounted on a notebook, a mobile phone, a game machine, an ATM, home appliances such as TV, and industrial IT devices. The display is an industrial field that continues to grow and has a great ripple effect in the entire industry. An ACF that must be essentially used in such a display and semiconductor packaging products continues to grow and is expanded and applied to other fields. The APL ACF product may be widely applied to the chip on glass (COG), chip on flex (COF) and chip on packaging (COP) of large-sized/small and medium-sized liquid crystal display (LCD)/organic light emitting diode (OLED) flat displays of an ultrafine pitch. Furthermore, if the type of conductive particles is changed, the APL ACF product may be applied to a CCD-CMOS camera module connection field for increasing the number of pixels of a high picture-quality camera and OLEDs for virtual reality (VR) that requires picture quality of UHD or more. Furthermore, an APL ACF having guaranteed reliability may also be applied to wearable electronic devices.

In particular, the demand for electronic devices, such as large-sized thin type TV, a notebook and a smartphone, is increased, and the demand of the ACF is also increased even in small and small-sized displays for a game machine, a vehicle navigator, and a vehicle. Accordingly, the ACF market continues to grow 5-6% after the year of 2010. However, price downward pressure for the ACF is severe due to materials used in a display part. Accordingly, although the final display demand is increased, the growth of the ACF is low, resulting in an entry barrier in volume economy.

In accordance with the embodiments, problems, such as electrical short and high contact resistance which may occur in an ultrafine pitch application, can be solved by suppressing a movement of conductive particles using a high-strength thin polymer film. This is a technology quite different from the existing Japan's ACF for a fine pitch, and may be considered to be the original patent technology advanced from the existing Japan's patent.

Figures 15A, 15B:
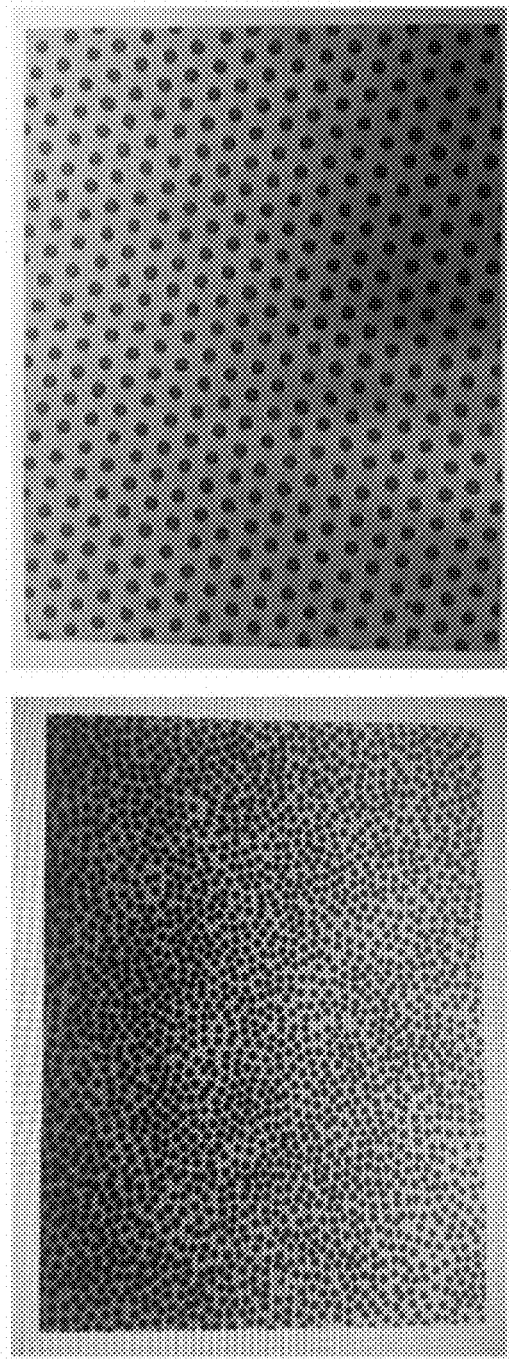
FIGS. 15A and 15B illustrate a conventional ACF to which a roll-to-roll system is difficult to apply.

FIGS. 15A and 15B illustrate a conventional ACF to which a roll-to-roll system is difficult to apply.

For example, Hitachi Chemical and Dexerials which now monopolize the ACF market do not implement a system for suppressing a movement of conductive particles and preventing an aggregation using a specific structure, such as an anchored polymer layer. As shown in FIG. 15A, Hitachi focuses on the ultra-dispersion of conductive particles. As shown in FIG. 15B, Dexerials focuses on the arrangement of conductive particles. However, the two companies have a difficulty in mass production because the roll-to-roll system is difficult to apply to corresponding ACF products.

In contrast, the APL ACF according to the present embodiment can be fabricated through a simple process using the roll-to-roll system, and lamination bonding with the non-conductive film (NCF) formed on the upper and lower parts may use the roll laminator widely used in the existing industry. Accordingly, the APL ACF has innovativeness that enables easy grafting with mass production, and can significantly reduce a cost in an equipment setup and process optimization process. Accordingly, a new growth engine can be provided by supplying the APL ACF of high performance to electronic material companies at a low price. It is expected that the market share of Hitachi Chemical and Dexerials that have gained the market in a monopoly form can be significantly reduced.

In accordance with the embodiments, the ACF including the polymer layer that restricts a movement of conductive particles by capturing them and that has tension stress can be provided.

Furthermore, in accordance with the embodiments, a solder or conductive particles including the solder are dispersed and disposed, and a movement of the conductive particles is restricted by capturing them when a flow of resin according to a bonding process is generated. Accordingly, the ACF capable of an electrical connection in a fine pitch or ultrafine pitch by implementing a high capture ratio using a small number of conductive particles and a method of manufacturing the same can be provided.

Furthermore, in accordance with the embodiments, the ACF including a polymer layer that forms an electrical connection between an upper electrode and a lower electrode by removing the polymer skin layer of the polymer layer surrounding the upper and lower parts of conductive particles through a vertical ultrasonic connection and that restricts a movement of the conductive particles and a method of manufacturing the same can be provided.

As described above, although the embodiments have been described in connection with the limited embodiments and the drawings, those skilled in the art may modify and change the embodiments in various ways from the description. For example, proper results may be achieved although the aforementioned descriptions are performed in order different from that of the described method and/or the aforementioned elements, such as the system, configuration, device, and circuit, are coupled or combined in a form different from that of the described method or replaced or substituted with other elements or equivalents.

Accordingly, other implementations, other embodiments, and the equivalents of the claims belong to the scope of the claims.

What is claimed is:

1. A method, the method comprising:
dissolving polymer to form a first polymer solution by mixing the polymer and a solvent at a determined ratio;
forming a second polymer solution by dispersing a plurality of conductive particles into the first polymer solution;
fabricating a polymer layer through roll-to-roll coating, by which the second polymer solution passes through a calendar roll along with a release paper;
removing a first portion of the polymer layer that surrounds a first surface portion of a conductive particle of the plurality of conductive particles and a second portion of the polymer layer that surrounds a second surface portion of the conductive particle, thereby exposing the first surface portion and the second surface portion of the conductive particle from the polymer layer, the first surface portion and the second surface portion of the conductive particle opposite to one another in a first direction; and
coupling an adhesive layer on the polymer layer and covering at least one of the first surface portion or the second surface portion of the conductive particle.

2. The method of claim 1, wherein the coupling the adhesive layer on the polymer layer includes assigning adhesiveness by laminating the adhesive layer comprising a non-conductive adhesive film (NCF) on upper and lower parts of the polymer layer.

3. The method of claim 1, further comprising connecting an upper electrode and a lower electrode through the conductive particles to form an electrical connection.

4. The method of claim 3, wherein connecting the upper electrode and the lower electrode through the conductive particles to form the electrical connection comprises connecting the upper electrode to the first surface portion of the conductive particle that is exposed from the polymer layer and connecting the lower electrode to the second surface portion of the conductive particle that is exposed from the polymer layer.

5. The method of claim 1, wherein the polymer layer comprises polymer connecting the plurality of conductive particles and having tension stress restricting a movement of the plurality of conductive particles.

6. The method of claim 1, wherein the plurality of conductive particles comprises a solder or conductive particles comprising the solder.

7. The method of claim 6, wherein the plurality of conductive particles comprising the solder or the conductive particles comprising the solder are dispersed and disposed in the polymer layer, and the polymer layer restricts a movement of the plurality of conductive particles by capturing the plurality of conductive particles.

8. A method of manufacturing an anisotropic conductive film (ACF) comprising a plurality of conductive particles, the method comprising:
dissolving polymer to form a first polymer solution by mixing the polymer and a solvent at a determined ratio;
forming a second polymer solution by dispersing a plurality of conductive particles into the first polymer solution;
fabricating a polymer layer through roll-to-roll coating, by which the second polymer solution passes through a calendar roll along with a release paper;
removing a first portion of the polymer layer that surrounds a first surface portion of a conductive particle of the plurality of conductive particles and a second portion of the polymer layer that surrounds a second surface portion of the conductive particle thereby exposing the first surface portion and the second surface portion of the conductive particle from the polymer layer, the first surface portion and the second surface portion of the conductive particle opposite to one another in a first direction; and
coupling an adhesive layer on the polymer layer and covering at least one of the first surface portion or the second surface portion of the conductive particle,
wherein the polymer layer restricts a movement of the plurality of conductive particles by capturing the conductive particles.

9. The method of claim 8, wherein the coupling the adhesive layer on the polymer layer includes assigning adhesiveness by laminating the adhesive layer comprising a non-conductive adhesive film (NCF) on upper and lower parts of the polymer layer.

10. The method of claim 8, further comprising connecting an upper electrode and a lower electrode through the exposed first and second surface portions of the conductive particles to form an electrical connection.

11. The method of claim 8, wherein the removing the first portion and the second portion of the polymer layer includes removing the first portion and the second portion of the polymer layer through a vertical ultrasonic bonding process.

12. The method of claim 8, wherein the polymer layer comprises polymer connecting the plurality of conductive particles and having tension stress restricting a movement of the plurality of conductive particles.

13. The method of claim 8, wherein the plurality of conductive particles comprises a solder or conductive particles comprising the solder.

14. The method of claim 13, wherein the plurality of conductive particles comprising the solder or the conductive particles comprising the solder are dispersed and disposed in the polymer layer, and the polymer layer restricts a movement of the plurality of conductive particles by capturing the plurality of conductive particles.

\* \* \* \* \*